US011778709B2

(12) United States Patent
Luo et al.

(10) Patent No.: US 11,778,709 B2
(45) Date of Patent: Oct. 3, 2023

(54) DRIVING CIRCUIT AND ASSOCIATED LAMP

(71) Applicant: SIGNIFY HOLDING B.V., Eindhoven (NL)

(72) Inventors: Zhijun Luo, Shanghai (CN); Betrand Johan Edward Hontele, Breda (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 212 days.

(21) Appl. No.: 17/286,153

(22) PCT Filed: Oct. 9, 2019

(86) PCT No.: PCT/EP2019/077289
§ 371 (c)(1),
(2) Date: Apr. 16, 2021

(87) PCT Pub. No.: WO2020/078783
PCT Pub. Date: Apr. 23, 2020

(65) Prior Publication Data
US 2022/0232682 A1    Jul. 21, 2022

(30) Foreign Application Priority Data

Oct. 18, 2018   (CN) .......................... 201821699293.7

(51) Int. Cl.
*H05B 45/30* (2020.01)
*H05B 45/395* (2020.01)
(Continued)

(52) U.S. Cl.
CPC ........... *H05B 45/395* (2020.01); *H05B 45/30* (2020.01); *H05B 45/3725* (2020.01); *G01R 19/16566* (2013.01); *H03K 5/082* (2013.01)

(58) Field of Classification Search
CPC ...... H05B 45/30; H05B 45/34; H05B 45/345; H05B 45/37; H05B 45/3725;
(Continued)

(56) References Cited

U.S. PATENT DOCUMENTS 9,370,058 B2    6/2016   Hsiung et al.
2012/0229045 A1*   9/2012   Kikuchi ................. H05B 45/10
                                                    315/224
2015/0373790 A1*  12/2015   Boswinkel ............ H05B 47/19
                                                    315/186

FOREIGN PATENT DOCUMENTS

CN    104427721 B    8/2016
JP    09-097925 A    4/1997
(Continued)

*Primary Examiner* — Long Nguyen

(57) ABSTRACT

Embodiments of the present disclosure provide a driving circuit and a lamp comprising the same. The driving circuit comprises inputs connected to a mains supply; outputs connected to an LED load; an output capacitor connected in parallel with the LED load; an LED driving current source connected to the outputs, and configured to convert the mains supply at the inputs to current at the outputs in an illumination mode, such that the current flows through the LED load and charges the output capacitor; and a control circuit configured to receive a standby signal to enable a standby mode, and to control the mains supply to linearly charge the output capacitor in the standby mode, such that an output voltage at the output can be lower than a turn-on voltage of the LED load and is higher than a preset lowest voltage. With the driving circuit, it is advantageous to reduce the delay from the standby mode to a minimum light emitting level, and meanwhile a lower power loss can be realized by linearly charging the output capacitor through the mains supply.

13 Claims, 2 Drawing Sheets

(51) Int. Cl.
*H05B 45/3725* (2020.01)
*G01R 19/165* (2006.01)
*H03K 5/08* (2006.01)

(58) Field of Classification Search
CPC .... H05B 45/375; H05B 45/395; H05B 45/40; H05B 45/44; H05B 45/46; H05B 45/48; H03K 5/082; H03K 5/086; G01R 19/16566; G01R 19/16571; G01R 19/16576
See application file for complete search history.

(56) References Cited

FOREIGN PATENT DOCUMENTS

| | | | |
|---|---|---|---|
| JP | 2015053225 | A | 3/2015 |
| WO | 2018162314 | A | 9/2018 |
| WO | 2018162314 | A1 | 9/2018 |

* cited by examiner

DRIVING CIRCUIT AND ASSOCIATED LAMP

CROSS-REFERENCE TO PRIOR APPLICATIONS

This application is the U.S. National Phase application under 35 U.S.C. § 371 of International Application No. PCT/EP2019/077289, filed on Oct. 9, 2019, which claims the benefit of Chinese Patent Application No. 20182169929.7, filed on Oct. 18, 2018. These applications are hereby incorporated by reference herein.

FIELD

Embodiments of the present disclosure generally relate to a driving circuit for an LED lamp, and an LED lamp comprising the driving circuit.

BACKGROUND

Due to the characteristics of light load and negative temperature of LEDs, a driving circuit dedicated to LED loads is typically required to drive the LED loads.

In general, there are two driving schemes for LED loads: a switched mode driving and a linear driving. A switched mode driving provides good current control accuracy and high overall efficiency. As an example, CN104427721B discloses a switched mode LED driving circuit that provides an LED driving circuit capable of supplying power to a microcomputer in a standby state in which the LEDs are not illuminated, the LED driving circuit is capable of, upon the input of a standby signal, outputting an output voltage lower than the voltage required for illuminating the LEDs through constant voltage control signals.

Whilst a linear driving is a simplest and most direct driving manner with the advantages including simple structures and low cost. Common linear driving circuits for LED loads are typically low-side driving, and in order to achieve higher power factor, capacitors in parallel with LED loads are typically large. Furthermore, in this linear driving scheme, a VDD supply dedicated to an auxiliary load circuits typically needs to be connected to the mains output via a diode and a capacitor.

SUMMARY

One of the objects of the present disclosure is at least to overcome the problem existing in the driving circuit of the prior art, i.e., a long delay from a standby mode to a minimum light emitting level of e.g., a linear driving circuit or a switching mode power supply driving circuit. Preferably, it can also solve the problem of high standby power consumption of the linear driving circuit. The basic idea of the present invention is that, under a standby mode, a linear power supply directly charges an output capacitor from a mains supply, to enable a voltage of the output capacitor lower than the turn-on voltage of the LED but above a lowest voltage, such that when switching from a standby mode to an illumination mode, the output capacitor can be quickly charged to illuminate the LED. It should be understood that word "directly" used herein means that the capacitor is connected to the mains supply via a linear driver and is charged by the mains supply with its frequency, rather than to the mains supply via a high frequency switching mode power supply.

In accordance with a first aspect of the present application, it provides a driving circuit. The driving circuit comprises inputs connected to a mains supply; outputs connected to an LED load; an output capacitor (C1) connected in parallel with the LED load; an LED driving current source connected to the outputs, and configured to convert the mains supply at the inputs to current at the outputs in an illumination mode, such that the current flows through the LED load and charges the output capacitor (C1); and a control circuit configured to receive a standby signal to enable a standby mode, and control the mains supply to linearly charge the output capacitor (C1) in the standby mode, wherein an output voltage at the outputs is lower than a turn-on voltage of the LED load and higher than a preset lowest voltage.

In the first aspect, the output voltage of the outputs is controlled lower than the turn-on voltage of the LED load and above a preset lowest voltage, which enables the output capacitor to be quickly charged to the turn-on voltage of the LED when switching from the standby mode to a minimum light emitting level. This greatly reduces the delay of switching from the standby mode to the minimum light emitting level. The application of this principle possesses novelty in the case that the driving circuit linearly charges the output capacitor directly through the mains supply.

In some embodiments, the LED driving current source comprises a linear current source that converts the mains supply at the inputs to current at the outputs with a controlled impedance in an illumination mode, such that the current flows through the LED load and charges the output capacitor. In the embodiment, a linear current source is a driving current source for the LEDs and meanwhile charges the output capacitor separately in the standby mode (in the case that LED stops illuminating). When the LED driving circuit is in the standby mode, the control circuit is configured to enable the linear current source to operate to charge the output capacitor if the amplitude of the mains supply is equal to the output voltage at the outputs, and if not, to control the linear current source to turn off. In the embodiments, the switch elements in the linear current source can operate at zero or lower voltage drop and stop operating when the voltage drop is high, thereby greatly reducing the standby power consumption of the LED driving circuit.

In some embodiments, the linear current source further comprises a PNP transistor, wherein an emitter of the PNP transistor is connected to a positive output of a rectifier bridge, a collector of the PNP transistor is connected to a positive output of the driving circuit. In the embodiments, with the PNP transistor, the cost of the driving circuit can be greatly reduced.

In some embodiments, the linear current source further comprises an NPN transistor, wherein a collector of the NPN transistor is connected to a base of the PNP transistor, an emitter of the NPN transistor is connected to a negative output of the rectifier bridge, and the base of the NPN transistor is connected to the control circuit. In the embodiments, the NPN transistor can be used in cascade with the PNP transistor as a linear current source, thereby effectively reducing the cost of the driving circuit.

In an alternative embodiment, the LED driving current source comprises a switching mode power supply, the driving circuit further comprises a standby linear current source different from the switching mode power supply. In the illumination mode, the switching mode power supply converts the mains supply at the inputs to current at the outputs, such that the current flows through the LED load and charges the output capacitor, the standby linear current source is turned off; and in the standby mode, the switching mode power supply is turned off, the standby linear current source connects the output capacitor to the input, and the output capacitor and the switching mode power supply are decoupled, the standby linear current source controls the mains supply to linearly charge the output capacitor.

This embodiment provides an alternative embodiment in which a commonly used switching mode power supply that supplies LEDs, such as an AC/DC PFC converter, is disabled under a standby mode without charging the output capacitor, which reduces the loss of the switching mode power supply. The voltage of the output capacitor is maintained by a different linear current source directly in accordance with the mains supply, resulting in lower cost and power consumption.

Further, an anode of the output capacitor is connected to the input that provides a positive voltage, and a cathode is connected to a current terminal of the standby linear power source, the other current terminal of the standby linear power supply is connected to the input that provides a negative voltage. This provides a connection between the output capacitor and the standby linear power supply throughout the circuit.

Further, the switching mode power supply comprises a buck converter, a boost converter, a buck-boost converter or a flyback converter, wherein an input thereof is connected to the inputs and an output thereof is connected to the output capacitor. It will be appreciated that the concept of the present invention is also applicable to other types of switching power supplies.

Further, the driving circuit further comprises a voltage detecting circuit for detecting a voltage on the output capacitor, the standby linear power supply is turned off when the voltage on the output capacitor is higher than the turn-on voltage of LED load and the standby linear power supply is enabled when the voltage on the output capacitor is lower than the lowest voltage. This embodiment can minimize the power loss when charging the output capacitor and improve the standby efficiency.

The voltage detecting circuit comprises a Zener diode connected to a cathode of the output capacitor, the Zener diode is reversely biased and connected to the control electrode of the standby linear power supply, the current terminal of the standby linear power supply is connected in series with the output capacitor via a charging resistor at the inputs. This embodiment provides a voltage detecting circuit composed of a plurality of basic electronic components, which does not require a complicated microcontroller, an integrated comparator, etc., and therefore low cost is realized.

In some embodiments, the driving circuit further comprises an auxiliary load circuit which operates according to the voltage at the positive output of the driving circuit and is configured to generate a standby signal or a dimming signal based on a user's input. In some embodiments, the voltage at the positive output of the driving circuit can be directly used as a VDD supply voltage of the auxiliary load circuit, in which the output voltage is reused without additional circuitry to generate the VDD supply voltage directly from the mains supply. This makes the power supply structure of the auxiliary load circuit more compact.

In some embodiments, the auxiliary load circuit comprises a power supply circuit and a radio frequency circuit, wherein the power supply circuit generates a supply voltage from the output voltage, the radio frequency circuit is configured to receive the supply voltage from the power supply circuit and transmit the standby signal or the dimming signal to the control circuit. In these embodiments, the RF circuit can be kept running at a lower power consumption, and the RF circuit can receive a remote control signal from the user, which makes the control means of the driving circuit more abundant, which is advantageous for intelligent home design.

In some embodiments, the driving circuit further comprises a current sensing device connected in series with the LED load and configured to sense current flowing through the LED load. In these embodiments, the driving circuit can thereby perform constant current control for the light output of the LED load based on the sensed current signal.

In some embodiments, a positive output of the rectifier bridge is connected to the control circuit via a sensing resistor to supply the control circuit with power and simultaneously detect a change in the voltage amplitude at the positive output of the rectifier bridge.

In some embodiments, the positive output of the driving circuit is electrically connected to the control circuit, to detect the output voltage at the positive output of the driving circuit. In these embodiments, the control circuit can monitor the voltage change at the output of the drive circuit so that a constant voltage output at the outputs can be achieved in the standby mode.

In accordance with a second aspect of the present application, there is provided a lamp, which comprises a driving circuit described in embodiments in the above first aspect.

BRIEF DESCRIPTION OF THE DRAWINGS

In the figures, similar/same reference numerals generally refer to the similar/same parts throughout the different views. The drawings are not necessarily to scale to emphasize the illustration of the principles of the invention. In the figures.

DETAILED DESCRIPTION OF EMBODIMENTS

Various embodiments of the present disclosure will be described in detail below with reference to the drawings. One or more examples of embodiments are illustrated by the figures. The examples are provided by way of illustration of the disclosure, and are not intended to limit the invention. For example, features illustrated or described as part of one embodiment may be used in another embodiment to create a further embodiment. These or other modifications and variations are intended to be included within the scope and spirit of the disclosure.

In order to more clearly understand the advantages of the linear driving circuit of the present disclosure, the structure of a common linear driving circuit in the prior art will be first described below.

Figure 1:
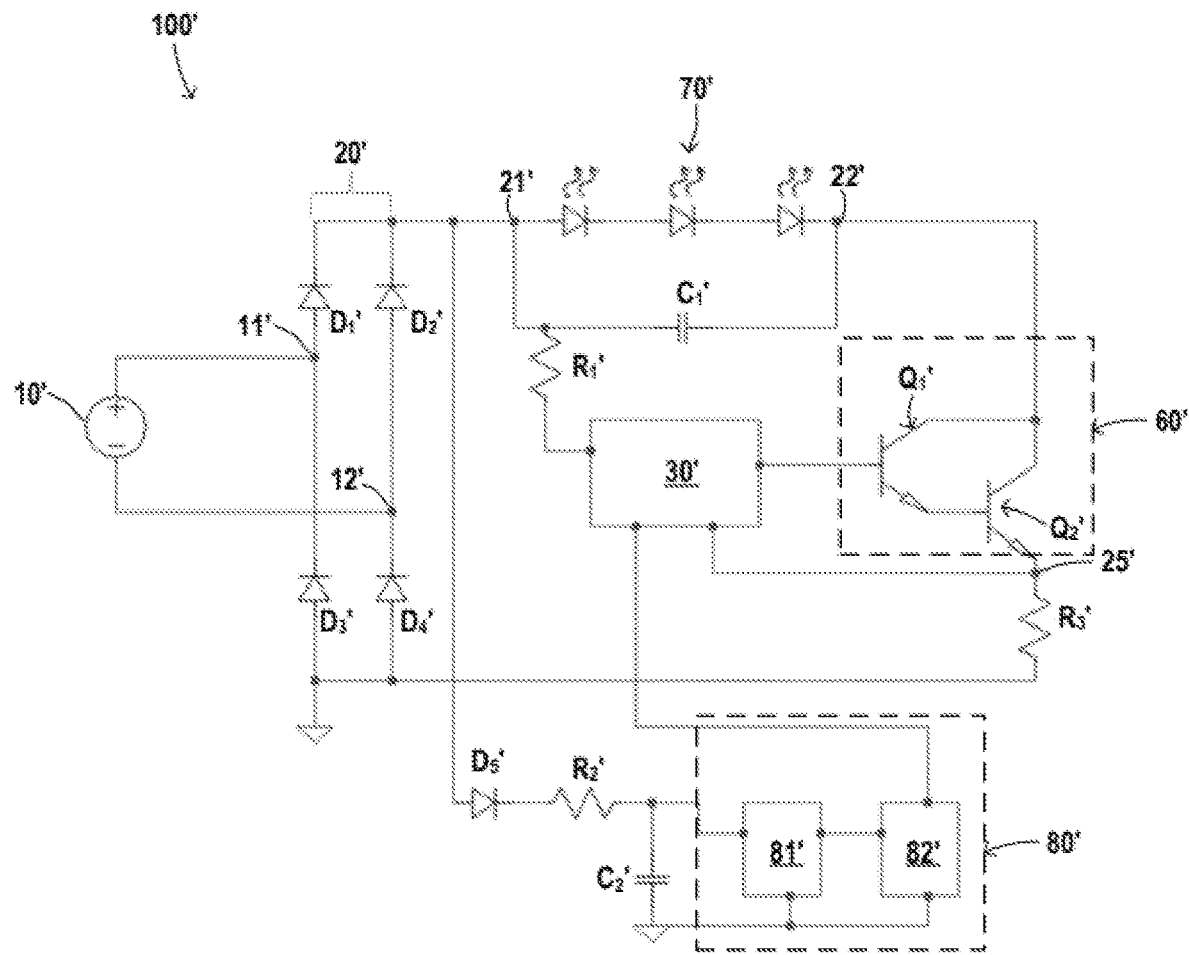
FIG. 1 shows a schematic diagram of a linear driving circuit common in the prior art.

FIG. 1 shows a schematic diagram of a linear driving circuit common in the prior art. As shown in FIG. 1, the exemplary linear driving circuit 100' includes inputs 11', 12' and outputs 21', 22', wherein the inputs 11', 12' are connected to mains supply 10', the outputs 21', 22' supply power to an LED load 70' via a rectifier bridge 20'.

As an example, in FIG. 1, the LED load 70' includes three LEDs in series. However, in other embodiments, an LED load 70' may include more or fewer LEDs in series or in parallel.

The linear driving circuit 100' may further include a rectifier bridge 20' including four diodes D1'-D4' for rectifying the mains supply received from the inputs 11', 12' to generate a rectified DC output.

An output capacitor C1' is connected in parallel with the LED load 70' to smooth the input to the LED load 70'. In addition, a control circuit 30' is connected to a positive output of the rectifier bridge 20' via a resistor R1', thereby supplying power to the control circuit 30'.

The linear driving circuit 100' may further include an auxiliary load circuit 80'. The auxiliary load circuit 80' can be connected to the positive output of the rectifier bridge 20' via a diode D5', a resistor R2' and a capacitor C2' to provide a Vdd power supply to the auxiliary load circuit 80'. The auxiliary load circuit 80' can generate an operation signal such as a standby signal or a dimming signal to the control circuit 30' based on user's input, wherein the standby signal can be used to stop the LED load from emitting light; and the dimming signal can be used to dim the LED load to output light of a desired characteristic. In some embodiments, the dimming signal can be used as the standby signal when the duty cycle of the dimming signal is zero.

In some embodiments, the auxiliary load circuit 80' may include a switching mode power supply circuit 81' and a radio frequency circuit 82', wherein the switching mode power supply circuit 81' may be used to supply power to the radio frequency circuit 82', and the radio frequency circuit 82' may be used to transmit an operation signal such as a standby signal or a dimming signal to the control circuit 30' based on the user's input (e.g., a remote control signal), and the control circuit 30' can transmit a control signal to a linear current source 60' based at least on the standby signal or the dimming signal, thereby controlling the ON and OFF of the linear current source 60'.

In some embodiments, the linear current source 60' may be formed by a cascade of two low-side switch elements Q1' and Q2', and one side of the linear current source 60' is connected to a negative terminal of the LED load 70' to control current through the LED load 70', the other side is connected to a negative output of the rectifier bridge 20' via a current sense resistor R3'. A node between the current sense resistor R3' and the linear current source 60' is coupled to a control circuit that senses the current flowing through the LED load 70' and the sensed current signal is fed back to a control circuit 30'.

In FIG. 1, by way of example only, the two low-side switch elements Q1', Q2' are both NPN transistors, wherein a base of Q1' is controlled by a control signal output by the control circuit 30', and an emitter of Q1' is connected to a base of Q2', a collector of Q1' is connected to a collector of Q2; the collector of Q2' is connected to the current sense resistor R3'.

In an operation state, the driving circuit 100' may enter a normal operation mode, a standby mode, or a shutdown mode based on an operation signal (such as a standby signal or a dimming signal) generated by the auxiliary load circuit 80'.

In the normal operation mode, the control circuit 30' may generate a switch control signal for the switch element Q1' to realize a dimming control of the LED load 70' based on a modulation signal (e.g., a dimming signal) from the auxiliary load circuit 80' and a current feedback signal from the current sensing resistor R3'.

In the standby mode, the control circuit 30' is configured to turn off the two low-side switch elements Q1' and Q2' in response to the standby signal. In the standby mode, the LED load 70' stops emitting light.

In real life, there is often a need to switch from the standby mode to a minimum light emitting level of the LED load 70'. However, when a switching from the above standby mode to the minimum light emitting level of the LED load 70' is requested by a user, the above-described driving circuit 100' may have some problems.

To be specific, in order to achieve high power, the capacitor C1 is generally required to be large. When the driving circuit 100' is in the standby mode for a long time, the capacitor C1 is generally fully discharged due to the presence of leakage current. As a result, when switching from the standby mode described above to the minimum light emitting level of the LED load 70', the capacitor C1 may take a considerable long time to be charged to a turn-on voltage that is required by the LED load 70', due to the function of the linear current source 60'. That is, in the case of the above-described driving circuit 100', the switching from the above standby mode to the minimum light emitting level of the LED load 70' may require a relatively long delay, which is highly undesirable. On the other hand, if in order to shorten the above-described delay, the driving circuit 100' is required to keep the switching element Q2' in operation during the standby mode, so as to maintain the charging current to the capacitor C1, which however results in an increase of the standby power consumption. This is also not desired.

Accordingly, it is an object of the present disclosure to provide a linear driving circuit capable of overcoming the technical problems of the above-described driving circuit 100' while the cost of the linear driving circuit would not be increased.

Figure 2:
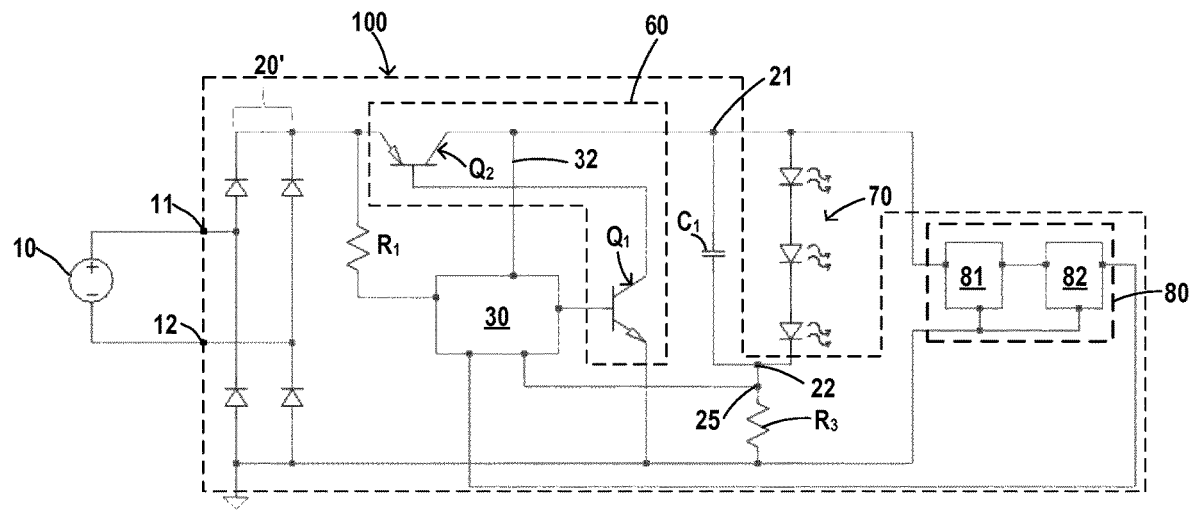
FIG. 2 shows a schematic diagram of a linear driving circuit in accordance with an embodiment of the present invention.

FIG. 2 shows a schematic diagram of a linear driving circuit 100 in accordance with an embodiment of the present invention. Similar to the linear driving circuit 100' described above, the linear driving circuit 100 also includes inputs 11 and 12 and outputs 21 and 22, wherein the inputs 11, 12 are connected to the mains supply 10, and the outputs 21 and 22 supply power to the LED load 70 via a rectifier bridge 20.

By way of example only, the LED load 70 shown in FIG. 2 also includes three LEDs in series. However, in other embodiments, the LED load 70 can include more or fewer LEDs in series or in parallel.

Similarly, the output capacitor C1 is connected in parallel with the LED load 70 to smooth input to the LED load 70. In addition, a control circuit 30 is also coupled to a positive output of a rectifier bridge 20 via a resistor R1 to supply power to the control circuit 30.

However, unlike the driving circuit 100' of FIG. 1, the driving circuit 100 includes a high-side linear current source 60, one side of which is connected to a positive output of the rectifier bridge 20 and the other side of which is connected to a positive terminal of the LED load 70. In addition, the linear current source component 60 is also connected to the control circuit 30, such that the linear current source component 60 can be controlled by the control circuit 30. The function of the linear current source 60 is to control the output current of the linear current source 60 via a variable impedance.

By way of example only, in some embodiments, the linear current source component 60 may be an amplifier formed by two bipolar transistor switch elements Q1 and Q2, where Q1 may be an NPN transistor, Q2 may be a PNP transistor, and an emitter of Q2 is connected to an positive output of the rectifier bridge 20, a collector of Q2 is connected to a positive output 21 of the driving circuit 100, a base of Q2 is connected to a collector of Q1, and a base of Q1 is connected to the control circuit 30, an emitter of Q1 is connected to a negative output of the rectifier bridge 20. Therefore, the base current of the transistor switch element Q1 can be controlled by the control circuit 30, thereby the collector-emitter current of the transistor switch element Q1 is controlled, which in turn is the base current of the transistor Q2, and finally the collector-emitter current of the transistor switch element Q2 is controlled. For example, when operated under a linear mode, the collector-emitter current of the transistor Q2 is β times the base current. In these embodiments, the use of a transistor switch element can effectively reduce cost of the linear driving circuit. However, it is to be appreciated that other linear current sources may be employed in other embodiments. For example, a MOSFET can be used to replace a bipolar junction transistor.

In addition, the driving circuit 100 may further include a current sensing device. In the example of FIG. 2, the current sensing device may include a current sensing resistor R3 connected in series with the LED load 70 for sensing current flowing through the LED load and the sensed current signals are fed back to the control circuit 30. In a normal operation mode, the control circuit 30 can control the current flowing through the LEDs according to the feedback sensed current signals.

In some embodiments, the control circuit 30 may be a linear control circuit, which may further reduce the cost of the driving circuit.

In some embodiments, the control circuit 30 can be further connected to the output of the driving circuit via an electrical connection line 32 so as to monitor the voltage at the output 21 of the driving circuit. It will be understood that since capacitor C1 is in parallel with the LED load 70 and the negative terminal of capacitor C1 is grounded via a resistor R3, in a standby mode voltage V2 at the output 21 of the detected driving circuit (or the positive terminal of capacitor C1) can then be considered equal to the voltage across C1.

In some embodiments, the linear driving circuit 100 can also include an auxiliary load circuit 80. As an example of the auxiliary load circuit 80, the auxiliary load circuit 80 may include, for example, a power supply circuit 81 and a radio frequency circuit 82, wherein the power supply circuit 81 may be used to supply power to the radio frequency circuit 82. In particular, the power supply circuit 81 is a switching mode power supply circuit, for example, a buck converter circuit. Alternatively, the power supply circuit 81 may be a further linear circuit such as an LDO (Low DropOut) circuit, or the like. The radio frequency circuit 82 can be used to transmit an operational signal such as a standby signal or a dimming signal to the control circuit 30 in accordance with user's input (e.g., a remote control signal). Specific radio frequency signals can be transmitted using Bluetooth, WiFi or Zigbee, and so on. The function of the standby signal is to stop the LED load from emitting light and enable the driving circuit into a standby mode; and the dimming signal is to dim the LED load in the normal/illuminating mode of the LED to output light of a desired characteristic. Note that although in the above description, the standby signal and the dimming signal are distinguished, it will be understood that in some embodiments, the dimming signal can also be used as a standby signal when duty cycle of the dimming signal is zero.

However, unlike the auxiliary load circuit 80' in FIG. 1, the auxiliary load circuit 80 may be directly connected to the positive output 21 of the driving circuit 100 without through any diode element or capacitive element, and runs according to the voltage at the positive output 21. The reason for this connection of the auxiliary load circuit 80 is that the auxiliary load circuit 80 can share the capacitive element C1 such that the auxiliary load circuit 80 does not need a capacitive element dedicated thereto.

The operating principle of the driving circuit 100 according to the embodiments of the present disclosure is described below.

In a normal operation mode, the control circuit 30 turns on the switch elements Q1 and Q2 in a linear current source component 60, and normal operating current can flow through the LED load 70, thereby enables LED load 70 to emit light. At this time, the voltage across the capacitor C1 is maintained above the turn-on voltage of the LED load 70. The current sense resistor R3 can sense the current flowing through the LED load 70 and the sensed current signals are fed back to the control circuit 30. Thus, the control circuit can control the linear current source component 60 based on the sensed current signals such that the linear current source component 60 can adjust the output current via a variable impedance, so as to achieve constant light output of the LED load 70.

In the normal operation mode, the control circuit 30 may further control current drawn from the linear current source component 60 based on the dimming signals from the auxiliary load circuit 80, so as to dim the LED load 70.

In this normal operation mode, the power supply circuit 81 also draws power from the outputs of the linear current source component 60. Since control of the linear current source 60 is based on the sensing of the LED current, the power supply circuit 81 does not affect the supply of constant current from the linear current source 60 to the LEDs.

However, once the control circuit 30 receives a standby signal from the auxiliary load circuit 80, the control circuit 30 will control the driving circuit 100 to enter a standby mode.

In a standby mode, the control circuit 30 will first turn off the linear current source 60, or increase its impedance to decrease input current, resulting in that voltage of the capacitor C1 drops below the turn-on voltage of the LED load 70 and then the LED load 70 does not emit any light.

As stated before, for the driving circuit 100' of the prior art, if the driving circuit 100' stays in this standby mode for a long time, the voltage across the capacitor C1 might be discharged to a relatively low voltage (or even 0), causing a problem that the switching from a standby mode to a minimum light emitting level of the LED load would take a rather long start time (also known as "delay"). In order to prevent this problem, the control circuit 30 in the present disclosure is configured to control the impedance of the linear current source 60 in the standby mode such that output voltage at the output 21 is lower than turn-on voltage of the LED load 70 but above a set lowest voltage.

Merely as an example, in some embodiments, the lowest voltage may be preset to be in a range of 50%-90% of the turn-on voltage of the LED load 70, for example, 60%, 70% or 80%. In other embodiments, the lowest voltage may be lower than 50% or slightly higher than 90%. Therefore, the lowest voltage is selectable, which makes it possible to adjust the standby power consumption of the driving circuit.

In order to achieve the desired output voltage at the output 21 of the driving circuit 100 as described above, the connection line 32 can sense the output voltage and control the impedance of the linear current source 60 accordingly such that the output voltage is within a desired range.

In some preferred embodiments, to reduce loss of the linear current source 60, voltage drop of the linear current source 60 should be controlled at a lower value. The control circuit 30 can compare a periodic voltage amplitude V1 from the rectified mains supply at the positive output of the rectifier bridge 20 detected via the resistor R1 with voltage V2 obtained at the output 21 of the driving circuit (or the positive terminal of the capacitor C1) via the electrical connection line 32, and only when the voltage amplitude V1 is equal to the output voltage V2, the linear current source is then controlled to operate; otherwise, the linear current source is turned off. In these embodiments, as the control circuit 30 operates only when the periodic voltage amplitude V1 is equal to the output voltage V2, thus the switching element Q2 of the linear voltage source 60 can be activated with zero voltage drop or low voltage, which significantly reduces power consumption in the standby mode. The word "equal" herein covers the scenario that the voltage amplitude V1 is slightly larger than the output voltage V2, to allow the input voltage to charge the output capacitor C1, and the voltage difference therebetween applied to the linear current source 60 is small, for example, less than 20V.

In some alternative embodiments, in a standby mode, the control circuit 30 may activate the linear current source 60 only when it is detected that the voltage V2 at the output drops to a preset lowest voltage or below, such that the linear current source 60 charges the capacitor C1, thereby enabling the voltage V2 at the output 21 of the driving circuit to rise above the preset lowest voltage. Then, the linear current source 60 can be turned off after a predetermined time so that the voltage V2 at the output 21 of the driving circuit is not higher than or equal to the turn-on voltage of the LED load 70, thereby keeping the LED load 70 in standby state without being illuminated. In these embodiments, switch element Q2 in the linear current source 60 can still be activated with a small voltage drop, which significantly reduces the power consumption in a standby mode.

In still other alternative embodiments, in the standby mode, the control circuit 30 may control the linear current source to operate only when the voltage amplitude V1 at the positive output of the rectifier bridge 20 detected via the resistor R1 is equal to a preset lowest voltage, so as to charge the capacitor C1; otherwise, the linear current source is controlled to be turned off. Likewise, in these embodiments, switching element Q2 in linear current source 60 can also be activated with a small voltage drop, which also significantly reduces the power consumption in a standby mode. Note that: in this case, the electrical connection line 32 for detecting the voltage V2 at the output 21 of the driving circuit (or the positive terminal of the capacitor C1) can be omitted.

Through the description of the operating state in the standby mode described above, the control circuit 30 can repeatedly turn on and turn off the linear current source 60 in a manner similar to hiccup/burst, and the voltage V2 at the output 21 of the driving circuit is substantially steadily kept lower than the turn-on voltage of the LED load 70, but above a preset lowest voltage. In other words, in the standby mode, the voltage V2 at the output 21 of the driving circuit can be in a substantially constant voltage state.

Further, it will be understood that the driving circuit 100 of the present disclosure may have the following beneficial effects:

First, in the standby mode, the voltage V2 at the output 21 of the driving circuit 100 may be substantially kept at a constant voltage slightly lower than the turn-on voltage of the LED load 7. When the user switches from the standby mode to a minimum light emitting level of the LED load, the voltage across the capacitor C1 can quickly reach the turn-on voltage of the LED load 70 after the linear current source 60 is turned on, thereby realizing the minimum light emitting level of the LED load 70. Therefore, as compared with the driving circuit 100' of the prior art, the delay for switching from the standby mode to the minimum light emitting level of the LED load is greatly shortened, which remarkably improves the performance of the linear driving circuit.

Second, in the standby mode, the switch element Q2 in the linear current source 60 can be operated with a small voltage drop, even a zero voltage drop, which also significantly reduces the standby power consumption of the driving circuit.

Third, in the standby mode, the substantially constant voltage V2 at the output of the above driving circuit 100 is obviously very suitable as a VDD power supply for the auxiliary load circuit, which helps to simplify the circuit and reduces the cost.

Fourth, the auxiliary load circuit 80 is directly connected to the outputs of the driving circuit 100, which allows the auxiliary load circuit 80 to share the capacitance C1 of the LED load 70. Therefore, a diode D5', a resistor R2' and a capacitor C2' are eliminated as compared with the driving circuit 100' of the prior art. This obviously further simplifies the circuit and reduces the cost.

In the above embodiments, during standby the linear power supply is used to charge the output capacitor directly from the mains supply, while during illumination the linear circuit is still used. In an alternative embodiment to be described below, when used with a switching mode power supply commonly seen in the industry, the linear power supply can be turned off by the switching mode power supply during an illumination mode; and the switching mode power supply itself can be turned off during standby, thereby avoiding the low efficiency of the switching mode power supply at extreme-low output power, but enabling the dedicated standby linear power supply different from the switching mode power supply to linearly charge the output capacitor directly from the mains supply.

Figure 3:
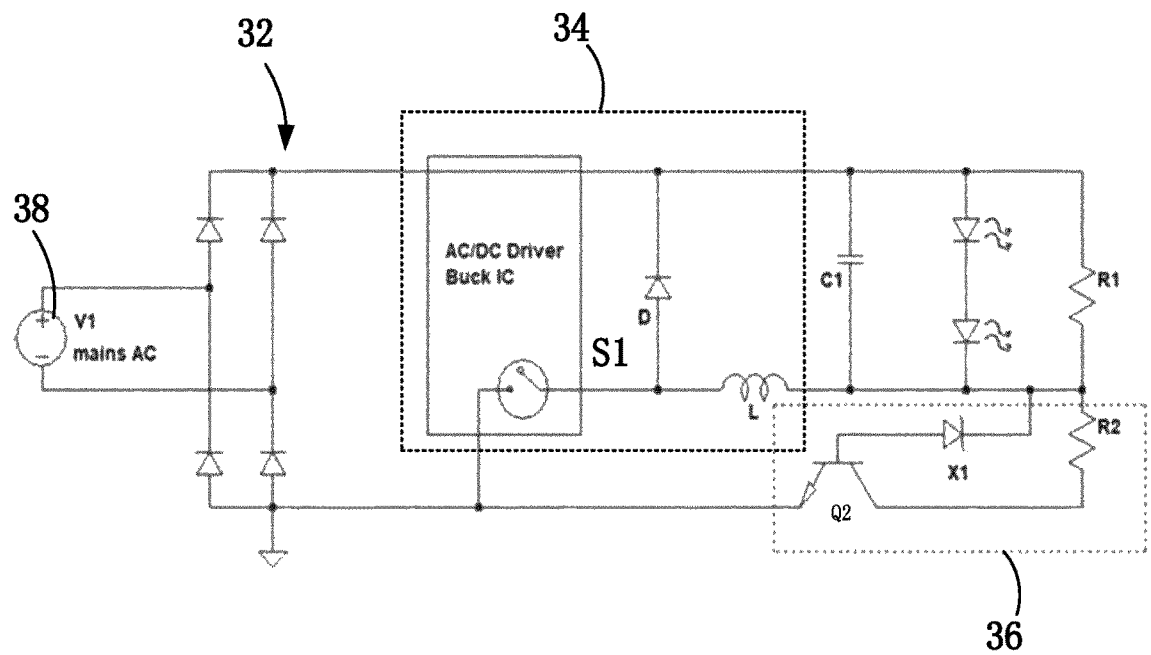
FIG. 3 shows a circuit including a switching mode power supply and a linear power supply in accordance with another embodiment of the present invention.

Referring specifically to FIG. 3, a driving circuit is coupled to a mains supply 38. The driving circuit includes a rectifier bridge 32, a switching mode power supply 34, an output capacitor C1 and a standby linear current source 36. The switching mode power supply 34 is a buck converter, including a switch S1, an inductor L, and a freewheeling diode D as shown in connection in the figure. It will be appreciated that other types of switch power supplies/converters are also applicable.

The driving circuit also includes a standby linear current source 36 that essentially includes a linear transistor Q2 that is different from the switching mode power supply 34.

In an illumination mode, the switching mode power supply 34 converts the mains supply at its inputs to current at its outputs, such that the current flows through the LED load 70, and charges the output capacitor C1, the standby linear current source 36 is turned off.

In a standby mode, the switching mode power supply 34 is turned off, e.g. by turning off a switch S1. The standby linear current source 36 connects the output capacitor C1 to the input, and the output capacitor C1 is decoupled from the switching mode power supply 34 (since the switch S1 has been turned off, the switching mode power supply is no longer operated to charge the output capacitor C1), the standby linear current source 36 controls the mains supply to linearly charge the output capacitor C1.

Specifically, the output capacitor C1 has an anode connected to said input that provides a positive voltage, and a cathode connected to a current terminal of a transistor Q2 of the standby linear power supply. Another current terminal of the transistor Q2 of the standby linear power supply is coupled to said input that provides a negative voltage.

The operation of the standby linear current source is realized by a voltage detecting circuit, which is configured to detect the voltage of the output capacitor C1. If the voltage of the output capacitor C1 is higher than turn-on voltage of the LED load (meaning that the switching mode power supply is operating), the standby linear power supply 36 is turned off, and the transistor Q2 is turned off; if the voltage of the output capacitor C1 is lower than the lowest voltage (meaning entering a standby state), the standby linear power supply 36 is enabled. The operation of the switching mode power supply 34 can be controlled by a microcontroller, which is not shown.

More specifically, the voltage detecting circuit includes a Zener diode X1 connected to the cathode of the output capacitor C1, and the Zener diode X1 is reversely biased and connected to a control electrode/a base of the transistor Q2 of the standby linear power source 34, a collector and a emitter of transistor Q2 of the standby linear power supply are connected in series with the output capacitor C1 through the charging resistor R2 to said inputs.

When the voltage of the output capacitor C1 is lower than a minimum value, the divided voltage on the Zener diode X1 will become large and break it down, and the base of the transistor Q2 will get a high voltage, so the transistor Q2 is turned on, the mains supply thus charges the capacitor C1 via the rectifier bridge 32, the capacitor C1, the resistor R2, and the transistor Q2 until the capacitor C1 is charged above the minimum value. Thereafter, the Zener diode X1 is turned off, charging is suspended until the capacitor C1 is discharged by other auxiliary modules being supplied by the capacitor C1, or slowly discharged by itself or through R1 to below the minimum value, and then the above process repeats.

The present invention has been described and illustrated in detail in the drawings and the foregoing description. The description and description are to be considered as illustrative and exemplary but not restrictive. The invention is not limited to the disclosed embodiments. Other variations to the disclosed embodiments can be understood and practiced by those skilled in the art by studying the figures, disclosure and attached claims.

In the claims, the word "comprising" does not exclude other elements and an indefinite article "a" or "an" does not exclude plurality. A single element or other unit may fulfill the functions of the various items set forth in the claims. The mere fact that certain measures are recited in mutually different embodiments or dependent claims does not indicate a combination of these measures cannot be used to advantage. The scope of protection of the present application covers any possible combination of the various features recited in the various embodiments or the dependent claims, without departing from the spirit and scope of the invention.

Any reference signs in the claims should not be construed as limiting the scope of the invention.

We claim:

1. A driving circuit, comprising:
    inputs adapted to connect to a mains supply;
    outputs adapted to connect to an LED load;
    an output capacitor connected in parallel with the LED load;
    an LED driving current source connected to the outputs, and configured to convert the mains supply at the inputs to current at the outputs in an illumination mode to flow through the LED load and charge the output capacitor; and
    a control circuit configured to receive a standby signal to enable a standby mode, and to control the output capacitor to be charged by the mains supply linearly in the standby mode, such that an output voltage at the output is lower than a turn-on voltage of the LED load and higher than a preset lowest voltage.

2. The driving circuit according to claim 1, wherein the LED driving current source comprises a linear current source that converts the mains supply at the inputs to current at the outputs with a controlled impedance in the illumination mode, such that the current flows through the LED load and charges the output capacitor, and
    when the LED driving circuit is in the standby mode, the control circuit is configured to operate the linear current source to charge the output capacitor in response to the amplitude of the mains supply being equal to the output voltage at the outputs; and to control the linear current source to turn off in response to the amplitude of the mains supply being unequal to the output voltage at the outputs.

3. The driving circuit according to claim 2, wherein the linear current source comprises a PNP transistor, wherein an emitter of the PNP transistor is connected to a positive output of a rectifier bridge, and a collector of the PNP transistor is connected to a positive output of the driving circuit.

4. The driving circuit according to claim 3, wherein the linear current source further comprises an NPN transistor, wherein a collector of the NPN transistor is connected to a base of the PNP transistor, an emitter of the NPN transistor is connected to a negative output of the rectifier bridge, and a base of the NPN transistor is connected to the control circuit.

5. The driving circuit according to claim 1, wherein the LED driving current source comprises a switching mode power supply,
    the driving circuit further comprises a standby linear current source different from the switching mode power supply,
    in the illumination mode, the switching mode power supply is configured to convert the mains supply at the inputs to current at the outputs to flow through the LED load and charge the output capacitor, and the standby linear current source is configured to be turned off; and
    in the standby mode, the switching mode power supply is configured to be turned off, the standby linear current source is configured to connect the output capacitor to the inputs, the output capacitor and the switching mode power supply are decoupled, and the standby linear current source is configured to control the mains supply to linearly charge the output capacitor.

6. The driving circuit according to claim 5, wherein an anode of the output capacitor is connected to the input that provides a positive voltage, a cathode of the output capacitor is connected to a current terminal of the standby linear power source, and the other current terminal of the standby linear power supply is connected to the input that provides a negative voltage,
    the switching mode power supply comprises a buck converter, a boost converter, a buck-boost converter or a flyback converter, wherein an input thereof is connected to the inputs and an output thereof is connected to the output capacitor, and the driving circuit further comprises a voltage detecting circuit for detecting a voltage on the output capacitor, the standby linear power supply is configured to be turned off in response to the voltage of the output capacitor being higher than the turn-on voltage of the LED load and the standby linear power supply is configured to be enabled in response to the voltage on the output capacitor being lower than the lowest voltage.

7. The driving circuit according to claim 6, wherein the voltage detecting circuit comprises a Zener diode connected to a cathode of the output capacitor, the Zener diode is further reversely biased and connected to a control electrode of the standby linear power supply, the current terminal of the standby linear power supply is connected in series with the output capacitor via a charging resistor to the inputs.

8. The driving circuit according to claim 1, further comprising an auxiliary load circuit connected to a positive output of the driving circuit and configured to generate a standby signal or a dimming signal based on a user's input.

9. The driving circuit according to claim 5, wherein the auxiliary load circuit comprises a power supply circuit and a radio frequency circuit, wherein the power supply circuit is configured to draw power from the outputs and generate a supply voltage in a standby mode or a non-standby mode, wherein the radio frequency circuit is configured to receive the supply voltage from the power supply circuit and to transmit the standby signal or the dimming signal to the control circuit.

10. The driving circuit according to claim 1, further comprising a current sensing device adapted to connect in series with the LED load and configured to sense current flowing through the LED load.

11. The driving circuit according to claim 3, wherein a positive output of the rectifier bridge is connected to the control circuit via a sensing resistor to supply power to the control circuit, and a change in a voltage amplitude at the positive output of the rectifier bridge is simultaneously detected.

12. The driving circuit according to claim 1, wherein a positive output of the driving circuit is connected to the control circuit via an electrical connection line to detect the output voltage at the positive output of the driving circuit.

13. A lamp comprising a driving circuit according to claim 1.

* * * * *